United States Patent

[11] 3,562,560

[72] Inventor Hiroyuki Osako
Yokohama, Japan
[21] Appl. No. 754,213
[22] Filed Aug. 21, 1968
[45] Patented Feb. 9, 1971
[73] Assignee Hitachi, Ltd.
Tokyo, Japan
a corporation of Japan
[32] Priority Aug. 23, 1967
[33] Japan
[31] 42/53,739

[54] TRANSISTOR-TRANSISTOR LOGIC
8 Claims, 4 Drawing Figs.

[52] U.S. Cl. .......... 307/303, 307/213; 317/235
[51] Int. Cl. .......... H03k 19/08
[50] Field of Search .......... 317/234, 235, 234/22, 234/9; 307/303, 213

[56] References Cited

UNITED STATES PATENTS

| | | | |
|---|---|---|---|
| 3,118,114 | 1/1964 | Barditch | 317/234X |
| 3,138,743 | 6/1964 | Kilby | 317/101 |
| 3,174,112 | 3/1965 | Stelmak | 317/235X |
| 3,189,798 | 6/1965 | Benjamin | 317/234 |
| 3,213,380 | 10/1965 | Husher | 317/235X |
| 3,335,341 | 8/1967 | Lin | 317/235(X22) |

*Primary Examiner*—James D. Kallam
*Attorney*—Craig, Antonelli, Stewart & Hill

ABSTRACT: Transistor-transistor logic, wherein a PN junction is formed in the semiconductor substrate to assure a sufficient transient current to flow when the two transistors at the output stage become transiently "on," said PN junction being reversely biased to exhibit a barrier capacitance and said capacitance being coupled in parallel with the circuit, thereby sufficient circuit operation and high reliability being obtained with a simple structure.

PATENTED FEB 9 1971

3,562,560

INVENTOR

HIROYUKI OSAKO

BY Craig & Antonelli

ATTORNEYS

TRANSISTOR-TRANSISTOR LOGIC

BACKGROUND OF THE INVENTION

1. Field of the Invention

This invention relates to an improved transistor-transistor logic.

2. Description of the Prior Art

The development of the techniques of semiconductor electronics including transistor techniques as a major part thereof and the related techniques have motivated the invention and development of the present-day IC (integrated circuits). The technique of IC has been developed not only for the purpose of microminiaturization, but also because it has the possibility of remarkably enhancing economies, reliability, simplicity of manufacture and easiness of usage all of which are essential for industrial products. The IC technique can be applied to general electronic devices and now it is in practical use.

The advantage obtained by integrating digital circuits have already been made clear and include higher reliability due to a decrease in junction points, a reduction of weight, an increase in efficiency due to simplification of the system composition and the like. As integration of logic circuits, the integration of DCTL (Direct Coupled Transistor Logic), RTL (Resistor Transistor Logic), DTL(Diode Transistor Logic), TTL (Transistor-Transistor Logic) and the like has already been put into practice. Among them, a TTL circuit is the most advanced saturation type digital IC, and has such properties as minimum power consumption, maximum speed, and maximum immunity to noise.

In a TTL circuit, two transistors at the output stage may become transiently "on" simultaneously and then a transient current is allowed to flow through the transistors. In a conventional TTL circuit, however, since a sufficient current cannot flow due to the impedance present at the line leading to the terminals of the TTL circuit, a potential drop occurs and a satisfactory circuit operation cannot be achieved.

SUMMARY OF THE INVENTION

An object of this invention is to provide a TTL wherein said deficiency is obviated.

Another object of the invention is to provide a TTL which is simple in structure, capable of sufficient circuit operation and has a high reliability. BRIEF DESCRIPTION OF THE DRAWINGS FIG. 1 is a TTL circuit diagram for the explanation of this invention;

DESCRIPTION OF THE PREFERRED EMBODIMENTS

Figure 1:
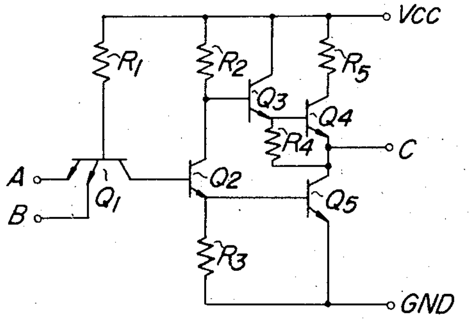

Description will be made on a TTL hereinbelow. FIG. 1 shows a NAND circuit using TTL. $Q_1$—$Q_5$ show transistors. $Q_1$ is a multiple emitter transistor and illustrated to have two emitters connected to the input terminals A and B. The connection point of the transistors $Q_4$ and $Q_5$ is connected to the output terminal C. $R_1$—$R_5$ indicate resistors, V*cc* indicates a terminal connected to the power supply and GND indicates a grounding terminal.

Figure 2:
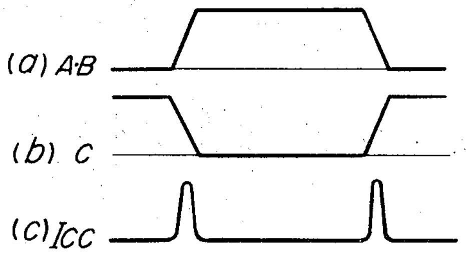
FIG. 2 is a waveform diagram for the explanation of the TTL shown in FIG. 1.

The operation of the TTL shown in FIG. 1 will now be described. When the multiple emitter transistor $Q_1$ is in a cutoff state, i.e. when high level input signals are applied to the input terminals A and B, a current flows through a resistor $R_1$ to the base of the transistor $Q_2$. Then the transistors $Q_2$ and $Q_5$ become "on" and the level of the output terminal C becomes low. Meanwhile, when the transistor $Q_1$ is "on" or when at least one of the input terminals A and B is supplied with a low-level signal, the current from the power source terminal V*cc* flows through the resistance $R_1$ and the base of the transistor $Q_1$ to the emitter of the transistor $Q_1$. Accordingly the transistors $Q_2$ and $Q_5$ are cutoff, the transistors $Q_3$ and $Q_4$ are turned "on" and a high-level signal is derived from the output terminal C. This behavior is shown in FIGS. 2(*a*) and (*b*), which show that the relation $C = \overline{A \cdot B}$ holds and the circuit described forms a NAND circuit.

The transient state of said operation will be described specifically with an attention to the level transition. When at least one of the input terminals A and B is supplied with a low level signal, the transistor $Q_4$ is "on" and the transistor $Q_5$ is cut off. When high-level signals are applied to both the terminals A and B, the transistor $Q_4$ is cutoff and the transistor $Q_5$ is "on." Generally, on account of the characteristics of the transistors and the influence of the peripheral elements, the transition from the "off" state to the "on" state occurs faster than the transition from the "on" state to the "off" state. Accordingly, the transistor $Q_4$ becomes cutoff with a time lag after the transistor $Q_5$ becomes "on." Therefore, there occurs a state where both the transistors $Q_4$ and $Q_5$ are "on" simultaneously. The same is true when the input signal is turned from a high-level to the low-level state and there occurs a transient state wherein the transistors $Q_4$ and $Q_5$ are "on" simultaneously. Due to said phenomena, a transient current I*cc* shown in FIG. 2(*c*)flows between the terminals V*cc* and GND. However, such a rapidly changing current I*cc* cannot be supplied sufficiently due to the presence of the line impedance extending to the terminal V*cc*. Thus the potential at the terminal V*cc* drops and a satisfactory circuit performance may not be achieved. The following expedients are taken to eliminate said effect of the line impedance.

Figure 3:
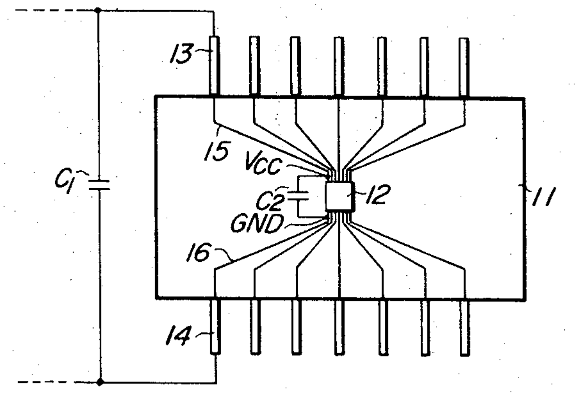
FIG. 3 is a schematic diagram for the explanation of this invention.

FIG. 3 shows the IC package 11, and the IC chip 12 is set substantially to the center thereof. In the IC chip 12, the TTL circuit shown in FIG. 1 is formed. The package 11 comprises 14 pins each of which is connected to the relevant terminal of the IC chip 12. The pins 13 are connected to the terminal V*cc* shown in FIG. 1 and the pins 14 are connected to the terminal GND by means of the lines 15 and 16, respectively. In order to prevent the influence of the line impedance, the pin 13 corresponding to the terminal V*cc* and the pin 14 corresponding to the terminal GND are coupled with a capacitor $C_1$. According to this method the influence of the line impedance between the pins 13 and 14 can be eliminated, but the influence of the line impedance of the lines 15 and 16 in the package 11 cannot be removed. The influence of the line impedance of the lines 15 and 16 can be removed and the transient current I*cc* can be assured to flow if a capacitor $C_2$ is inserted between the terminals V*cc* and GND. However, it is impossible to couple such a capacitor to a very minute IC and said method has not been employed in the field.

According to this invention, this problem is solved by another method. Thus a sufficient I*cc* current is assured in a transient state and sufficient circuit operation is achieved.

Figure 4:
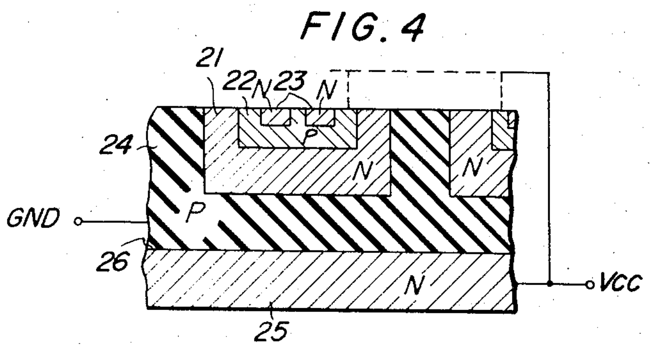
FIG. 4 is a sectional diagram of an embodiment of TTL according to this invention.

FIG. 4 shows a sectional diagram of a TTL according to this invention, wherein the part of the transistor $Q_1$ is particularly magnified. The semiconductor substrate 24 is illustrated to have a P-type conductivity. An N-type impurity is diffused into the substrate 24 to form an N-type collector layer 21, a P-type impurity is diffused into the collector layer 21 to form a P-type base layer 22 and an N-type impurity is diffused into the base layer 22 to form N-type emitter layers 23. The substrate 24 comprises not only the transistor $Q_1$, but also other circuit elements. Each element is provided with terminals and is connected to the other terminals by an appropriate method to compose a circuit.

Further, in order to assure the transient current to flow in the transient state, an N-type impurity is diffused into the substrate 24 to form an N-type layer 25. Most effective result was obtained when an N-type impurity was diffused into the back surface of the substrate 24.

The substrate 24 is grounded by a GND terminal and the N-type layer 25 is connected to the power source terminal V*cc* so that it may always be biased reversely. Thus the junction part 26 made between the P-type substrate 24 and the N-type layer 25 has an electrostatic capacitance on account of the barrier capacitance of said junction part 26. The semiconductor substrate is not limited to be of P-type. When the substrate is of N-type, a P-type impurity is diffused to form a P-type layer to give a barrier capacitance to the junction part. Namely, there is formed, in a substrate having one conductivity type, a layer having the conductivity type opposite to said one conductivity type to form a PN junction. When the PN junction is reversely biased, the junction part exhibits a barrier capacitance which is connected in parallel to a circuit such as shown in FIG. 1 to assure the transient current to flow.

Thereby, the transient current flowing through the circuit in the transient state is assured and a sufficient circuit operation can be achieved without lowering the potential at the terminal V*cc*.

I claim:

1. A transistor-transistor logic circuit comprising a semiconductor substrate having one conductivity type and a layer formed in said substrate and having the conductivity type opposite to said one conductivity type, said substrate and said layer forming a PN junction which exhibits a barrier capacitance when reversely biased, and said barrier capacitance being coupled in parallel to the circuit of the logic to assure a sufficient transient current to flow through the circuit.

2. A transistor-transistor logic circuit according to claim 1, wherein said layer is located at the back surface of said substrate.

3. An integrated circuit device comprising:

a semiconductor substrate of a first conductivity type;

a transistor-transistor logic circuit formed in said semiconductor substrate;

a semiconductor layer having a second conductivity type which is opposite to said first conductivity type formed in said substrate, wherein said layer and said substrate exhibit a barrier capacitance when reversely biased; and means connecting said layer in parallel to the transistor-transistor logic circuit.

4. The integrated circuit device of claim 3, wherein said semiconductor substrate has a first and a second principal surface, said first and second principal surfaces being on nonadjacent surfaces of the substrate wherein said transistor-transistor logic circuit is formed in said first principal surface and said semiconductor layer is formed on said second principal surface.

5. The integrated circuit device of claim 4, wherein said first and second principal surfaces are substantially parallel.

6. The integrated circuit device of claim 3, wherein the substrate is connected to ground and the layer is connected to a power source.

7. The integrated circuit device of claim 3, wherein said substrate has a P-type conductivity and said layer has an N-type conductivity.

8. The integrated circuit device of claim 3, wherein said substrate has an N-type conductivity and said layer has a P-type conductivity.